United States Patent
Abe et al.

(10) Patent No.: US 12,046,389 B2
(45) Date of Patent: Jul. 23, 2024

(54) CONDUCTIVE FILM AND METHOD FOR PRODUCING SAME

(71) Applicant: Murata Manufacturing Co., Ltd., Nagaokakyo (JP)

(72) Inventors: Masanori Abe, Nagaokakyo (JP); Takeshi Torita, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 18/168,149

(22) Filed: Feb. 13, 2023

(65) Prior Publication Data
US 2023/0187098 A1 Jun. 15, 2023

Related U.S. Application Data

(63) Continuation of application No. PCT/JP2021/032162, filed on Sep. 1, 2021.

(30) Foreign Application Priority Data

Sep. 2, 2020 (JP) .................................. 2020-147673

(51) Int. Cl.
*H01B 1/02* (2006.01)
*H01B 5/00* (2006.01)
*H01B 13/00* (2006.01)
*H01B 13/30* (2006.01)

(52) U.S. Cl.
CPC ............... *H01B 1/02* (2013.01); *H01B 5/002* (2013.01); *H01B 13/0036* (2013.01); *H01B 13/30* (2013.01)

(58) Field of Classification Search
CPC ....................................................... H01B 1/02
See application file for complete search history.

(56) References Cited

U.S. PATENT DOCUMENTS

2020/0102444 A1* 4/2020 Cho .......................... C08K 9/04

FOREIGN PATENT DOCUMENTS

JP 2017076739 A 4/2017
JP 2020093971 A 6/2020

OTHER PUBLICATIONS

International Search Report in PCT/JP2021/032162, mailed Oct. 26, 2021, 3 pages.
Natu et al., "Edge Capping of 2D-MXene Sheets with Polyanionic Salts to Mitigate Oxidation in Aqueous Colloidal Suspensions," Manuscript, Angewandte Chemie International Edition, Sep. 2019, pp. 1-22.
Zhao et al., "Antioxidants Unlock Shelf-Stable Ti3C2Tx (MXene) Nanosheet Dispersions," Matter, Aug. 2019, vol. 1, pp. 513-526.

* cited by examiner

*Primary Examiner* — William D Young
(74) *Attorney, Agent, or Firm* — ArentFox Schiff LLP

(57) ABSTRACT

A conductive film that includes: particles of a layered material including one or more layers, wherein each of the one or more layers includes a layer body represented by: $M_mX_n$, wherein M is at least one metal of Group 3, 4, 5, 6, or 7, X is a carbon atom, a nitrogen atom, or a combination thereof, n is 1 to 4, m is greater than n and 5 or less, a modification or termination T is present on a surface of the layer body, where the T is at least one selected from the group consisting of a hydroxyl group, a fluorine atom, a chlorine atom, an oxygen atom, or a hydrogen atom; and a phosphorus atom in an amount of 0.001% by mass to less than 0.09% by mass.

11 Claims, 3 Drawing Sheets

CONDUCTIVE FILM AND METHOD FOR PRODUCING SAME

CROSS REFERENCE TO RELATED APPLICATIONS

The present application is a continuation of International application No. PCT/JP2021/032162, filed Sep. 1, 2021, which claims priority to Japanese Patent Application No. 2020-147673, filed Sep. 2, 2020, the entire contents of each of which are incorporated herein by reference.

FIELD OF THE INVENTION

The present invention relates to a conductive film and a method for producing the same.

BACKGROUND OF THE INVENTION

In recent years, MXene has attracted attention as a novel material having conductivity. MXene is a kind of so-called two-dimensional material, and is a layered material having a form of one or more layers as described later. In general, MXene has a form of particles (can include powders, flakes, nanosheets, and the like) of such a layered material.

At present, various studies have been made for application of MXene to various electronic devices. However, it is known that the conductivity of MXene decreases over time (for example, in about several days to one month), and the main cause of this is considered to be the fact that MXene is easily oxidized. In order to industrially utilize MXene, oxidation of MXene is a serious problem.

Non-Patent Document 1 reports that by adding a polyphosphate (0.1 M sodium polyphosphate) or the like to an aqueous colloidal suspension of MXene, the edges of individual MXene flakes can be capped, and oxidation of MXene can be suppressed. Non-Patent Document 2 reports that by adding sodium L-ascorbate to a dispersion of MXene nanosheets, the edges of MXene nanosheets can be protected, and oxidation of MXene can be suppressed.

Non-patent Document 1: Varun Natu et al., "Edge Capping of 2D-MXene Sheets with Polyanionic Salts to Mitigate Oxidation in Aqueous Colloidal Suspensions", Angewandte Chemie International Edition, 2019, Volume 58, Issue 36, pp. 12655-12660

Non-patent Document 2: Xiaofei Zhao et al., "Antioxidants Unlock Shelf-Stable $Ti_3C_2T_x$ (MXene) Nanosheet Dispersions", Matter, 2019, Volume 1, Issue 2, pp. 513-526

SUMMARY OF THE INVENTION

However, the oxidation prevention method reported in Non-Patent Document 1 is limited to a suspension or dispersion of MXene, and in a dry film of MXene, the influence on the initial conductivity and the effect of oxidation prevention (reduction in decrease in conductivity over time) are not confirmed. In addition, in the oxidation prevention method reported in Non-Patent Document 2, the initial conductivity is ½ or less in a dry film of MXene (see, Figure S6 of Non-Patent Document 2). In the conventional oxidation prevention methods, not realized is a conductive film which contains MXene and with which both of suppressing decrease in initial conductivity and effectively reducing a decrease in conductivity over time by oxidation prevention can be achieved (in other words, a conductive film capable of maintaining high conductivity).

An object of the present invention is to provide a conductive film containing MXene and capable of maintain high conductivity, and a method for producing the conductive film.

According to one gist of the present invention, provided is a conductive film comprising:

particles of a layered material including one or more layers, wherein each of the one or more layers includes a layer body represented by:

$M_mX_n$ wherein M is at least one metal of Group 3, 4, 5, 6, or 7,
X is a carbon atom, a nitrogen atom, or a combination thereof,
n is 1 to 4, and
m is greater than n and 5 or less; and
a modification or termination T is present on a surface of the layer body, where T is at least one selected from the group consisting of a hydroxyl group, a fluorine atom, a chlorine atom, an oxygen atom, or a hydrogen atom; and a phosphorus atom in an amount of 0.001% by mass to less than 0.09% by mass. With such a structure, the conductive film maintains a conductivity of 2,000 S/cm or more.

In one aspect of the first gist of the present invention, the phosphorus atom may be derived from a salt of a phosphoric acid group-containing polyanion.

In one aspect of the first gist of the present invention, the salt of the phosphoric acid group-containing polyanion may be at least one selected from the group consisting of a polyphosphate metal salt, a pyrophosphate metal salt, a tripolyphosphate metal salt, or a hexametaphosphate metal salt.

In one aspect of the first gist of the present invention, wherein the conductive film may be used as an electrode or an electromagnetic shield. The electrode may be any one of a capacitor electrode, a battery electrode, a bioelectrode, a sensor electrode, or an antenna electrode.

According to a second gist of the present invention, provided is a method for producing a conductive film, the method comprising:

(a) preparing a mixture comprising particles of a layered material including one or more layers and a salt of a phosphoric acid group-containing polyanion in an aqueous solvent, wherein each of the one or more layers includes a layer body represented by:

$M_mX_n$ wherein M is at least one metal of Group 3, 4, 5, 6, or 7,
X is a carbon atom, a nitrogen atom, or a combination thereof,
n is 1 to 4,
m is greater than n and 5 or less, and
a modification or termination T is present on a surface of the layer body, where T is at least one selected from the group consisting of a hydroxyl group, a fluorine atom, a chlorine atom, an oxygen atom, or a hydrogen atom,
a concentration of the particles of the layered material in the mixture is 10 mg/mL to 250 mg/mL, and
a molar concentration of the salt of the phosphoric acid group-containing polyanion in the mixture is 0.001 mol/L to 0.1 mol/L; and (b) drying the mixture to obtain a conductive film.

In one aspect of the second gist of the present invention, the method may further comprise: after the step (a) and before the step (b), washing the mixture with another aqueous solvent while a shear force is applied to the mixture.

In one aspect of the second gist of the present invention, the salt of the phosphoric acid group-containing polyanion in the step (a) is a salt of a metal ion and a polyanion having a plurality of phosphoric acid groups, and the conductive film obtained in the step (b) comprises 0.5% by mass or less of a metal element corresponding to the metal ion.

In one aspect of the second gist of the present invention, the conductive film according to the present invention may be produced.

According to one aspect of the present disclosure, a conductive film contains particles of a predetermined layered material (also referred to as "MXene" in the present specification), further contains a phosphorus atom in an amount of 0.001% by mass to less than 0.09% by mass, and maintains a conductivity of 2,000 S/cm or more, whereby a conductive film containing MXene and capable of maintaining high conductivity is provided. Furthermore, according to another aspect of the present disclosure, a mixture containing particles of a predetermined layered material in an amount of 10 mg/mL to 250 mg/mL and a salt of a phosphoric acid group-containing polyanion in an amount of 0.001 mol/L to 0.1 mol/L in an aqueous solvent is prepared, and the mixture is dried, whereby a conductive film can be produced.

BRIEF DESCRIPTION OF THE DRAWINGS

FIG. 1(a) is a schematic cross-sectional view of the conductive film, and FIG. 1(b) is a schematic perspective view of MXene in the conductive film.

FIG. 2(a) illustrates a single-layer MXene particle, and FIG. 2(b) illustrates a multi-layer (exemplarily, two-layer) MXene particle.

DESCRIPTION OF PREFERRED EMBODIMENTS OF THE INVENTION

Hereinafter, a conductive film and a method for producing a conductive film according to an embodiment of the present invention will be described in detail, but the present invention is not limited to such an embodiment.

Figure 1A:
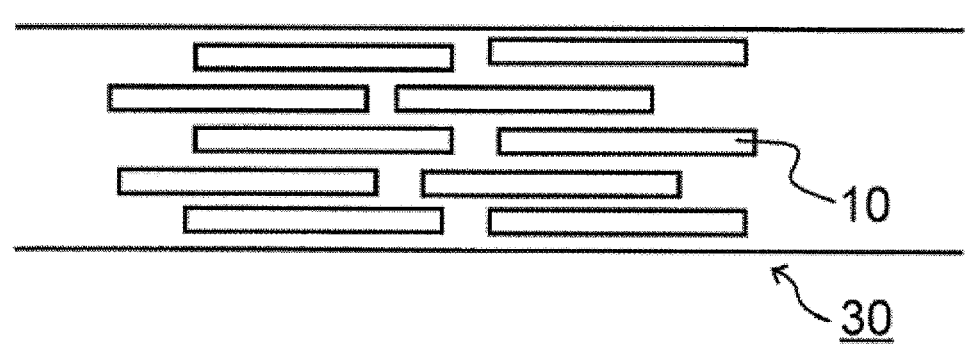
FIGS. 1(a) and 1(b) are views for explaining a conductive film according to an embodiment of the present invention.

With reference to FIG. 1(a), a conductive film 30 of the present embodiment contains particles 10 of a predetermined layered material, further contains a phosphorus atom (not illustrated) in an amount of 0.001% by mass to less than 0.09% by mass, and which results in the conductive film maintaining a conductivity of 2,000 S/cm or more. Hereinafter, the conductive film 30 of the present embodiment will be described through the production method thereof.

The method for producing the conductive film 30 of the present embodiment comprises: (a) preparing a mixture containing particles of a predetermined layered material and a salt of a phosphoric acid group-containing polyanion in an aqueous solvent, wherein a concentration of the particles of the layered material in the mixture is 10 mg/mL to 250 mg/mL, and a molar concentration of the salt of the phosphoric acid group-containing polyanion in the mixture is 0.001 mol/L to 0.1 mol/L; and (b) drying the mixture to obtain a conductive film.

Step (a)

First, particles of a predetermined layered material are prepared. The predetermined layered material usable in the present embodiment is MXene, and is defined as follows:

a layered material including one or more layers, each of the layers including a layer body represented by:

$M_mX_n$ wherein M is at least one metal of Group 3, 4, 5, 6, or 7, and can include a so-called early transition metal, for example, at least one selected from the group consisting of Sc, Ti, Zr, Hf, V, Nb, Ta, Cr, Mo, or Mn, X is a carbon atom, a nitrogen atom, or a combination thereof, n is 1 to 4, and m is greater than n and 5 or less (the layer body can have a crystal lattice in which each X is positioned in an octahedral array of M); and a modification or termination T (T is at least one selected from the group consisting of a hydroxyl group, a fluorine atom, a chlorine atom, an oxygen atom, or a hydrogen atom) is present on a surface (more particularly, at least one of two opposing surfaces of the layer body) of the layer body (the layered material can be understood as a layered compound and may be also denoted "$M_mX_nT_s$", wherein s is any number, and x may conventionally be used instead of s). Typically, n can be, but is not limited to, 1, 2, 3, or 4.

In the above formula of MXene, M is preferably at least one selected from the group consisting of Ti, Zr, Hf, V, Nb, Ta, Cr, Mo, or Mn, and more preferably at least one selected from the group consisting of Ti, V, Cr, or Mo.

Such MXene can be synthesized by selectively etching (removing and optionally layer-separating) A atoms (and optionally some of M atoms) from a MAX phase. The MAX phase is represented by the following formula:

$M_mAX_n$ wherein M, X, n, and m are as described above, and A is at least one element of Group 12, 13, 14, 15, or 16, is normally an element of Group A, typically an element of Group IIIA and Group IVA, and more particularly can include at least one selected from the group consisting of Al, Ga, In, Tl, Si, Ge, Sn, Pb, P, As, S, or Cd, and is preferably Al, and has a crystal structure in which a layer composed of A atoms is positioned between two layers represented by $M_mX_n$ (can have a crystal lattice in which each X is positioned in an octahedral array of M). Typically, in the case of m=n+1, the MAX phase has a repeating unit in which one layer of X atoms is each disposed between adjacent layers of M atoms of n+1 layers (these layers are also collectively referred to as "$M_mX_n$ layer"), and a layer of A atoms ("A atom layer") is disposed as a layer next to the (n+1)th layer of M atoms, but the present invention is not limited thereto. By selectively etching (removing and optionally layer-separating) A atoms (and optionally some of M atoms) from a MAX phase, an A atom layer (and optionally some of M atoms) is removed, and the exposed surface of the $M_mX_n$ layer is modified with a hydroxyl group, a fluorine atom, a chlorine atom, an oxygen atom, a hydrogen atom, or the like existing in an etching solution (usually, but not limited to, an aqueous solution of a fluorine-containing acid is used), and thereby the surface is terminated. The etching can be performed using an etching solution containing F⁻, and the etching method may be, for example, a method using a mixed solution of lithium fluoride and hydrochloric acid, a method using hydrofluoric acid, or the like.

As will be described later, in order to obtain a conductive film having high orientation of MXene particles, it is preferable to perform etching (including washing and centrifugation or the like) so as to reduce the amount of A atoms remaining in MXene particles. A smaller amount of remaining A atoms contributes to further increasing the purity of a single-layer MXene and further increasing the in-plane dimension of single-layer MXene particles in a particulate matter described later and a slurry containing the particulate matter.

Furthermore, in order to obtain a conductive film having high orientation of MXene particles, it is preferable to perform a treatment for causing layer separation (delamination, separating multi-layer MXene into smaller number of layers of MXene, preferably into single-layer MXene) of MXene after etching. In order to obtain two-dimensional MXene particles (particles of single-layer/few-layer MXene, preferably single-layer MXene particles) having a larger aspect ratio, it is more preferable that such a layer separation treatment causes less damage to MXene particles. The layer separation treatment can be performed by any appropriate method, for example, ultrasonic treatment, handshaking, an automatic shaker, or the like. In ultrasonic treatment, too large shear force is applied and the MXene particles can be broken (can be broken into small pieces), and it is therefore preferable to apply an appropriate shear force by handshaking, an automatic shaker, or the like. The layer separation treatment may include centrifugation and purification, and the like after a shear force is applied to the MXene particles. When the number of A atoms remaining in the MXene particles is smaller, the influence of the bonding force of the A atoms is smaller, so that the MXene particles can be effectively separated into layers with a smaller shear force.

As MXene, those are known in which the above formula $M_mX_n$ is represented as follows:

$Sc_2C$, $Ti_2C$, $Ti_2N$, $Zr_2C$, $Zr_2N$, $Hf_2C$, $Hf_2N$, $V_2C$, $V_2N$, $Nb_2C$, $Ta_2C$, $Cr_2C$, $Cr_2N$, $Mo_2C$, $Mo_{1.3}C$, $Cr_{1.3}C$, $(Ti,V)_2C$, $(Ti,Nb)_2C$, $W_2C$, $W_{1.3}C$, $Mo_2N$, $Nb_{1.3}C$, $Mo_{1.3}Y_{0.6}C$ wherein "1.3" and "0.6" mean about 1.3 (=4/3) and about 0.6 (=2/3), respectively, $Ti_3C_2$, $Ti_3N_2$, $Ti_3(CN)$, $Zr_3C_2$, $(Ti,V)_3C_2$, $(Ti_2Nb)C_2$, $(Ti_2Ta)C_2$, $(Ti_2Mn)C_2$, $Hf_3C_2$, $(Hf_2V)C_2$, $(Hf_2Mn)C_2$, $(V_2Ti)C_2$, $(Cr_2Ti)C_2$, $(Cr_2V)C_2$, $(Cr_2Nb)C_2$, $(Cr_2Ta)C_2$, $(Mo_2Sc)C_2$, $(Mo_2Ti)C_2$, $(Mo_2Zr)C_2$, $(Mo_2Hf)C_2$, $(Mo_2V)C_2$, $(Mo_2Nb)C_2$, $(Mo_2Ta)C_2$, $(W_2Ti)C_2$, $(W_2Zr)C_2$, $(W_2Hf)C_2$, $Ti_4N_3$, $V_4C_3$, $Nb_4C_3$, $Ta_4C_3$, $(Ti,Nb)_4C_3$, $(Nb,Zr)_4C_3$, $(Ti_2Nb_2)C_3$, $(Ti_2Ta_2)C_3$, $(V_2Ti_2)C_3$, $(V_2Nb_2)C_3$, $(V_2Ta_2)C_3$, $(Nb_2Ta_2)C_3$, $(Cr_2Ti_2)C_3$, $(Cr_2V_2)C_3$, $(Cr_2Nb_2)C_3$, $(Cr_2Ta_2)C_3$, $(Mo_2Ti_2)C_3$, $(Mo_2Zr_2)C_3$, $(Mo_2Hf_2)C_3$, $(Mo_2V_2)C_3$, $(Mo_2Nb_2)C_3$, $(Mo_2Ta_2)C_3$, $(W_2Ti_2)C_3$, $(W_2Zr_2)C_3$, $(W_2Hf_2)C_3$ Typically, in the above formula, M can be titanium or vanadium, and X can be a carbon atom or a nitrogen atom. For example, the MAX phase is $Ti_3AlC_2$, and MXene is $Ti_3C_2T_s$ (in other words, M is Ti, X is C, n is 2, and m is 3).

The MXene may contain a relatively small amount of remaining A atoms, for example, 10 mass % or less with respect to the original A atoms. The residual amount of A atoms can be preferably 8 mass % or less, and more preferably 6 mass % or less. However, even when the residual amount of A atoms exceeds 10 mass %, there can be no problem depending on the application and use conditions of the conductive film.

Figure 2A:
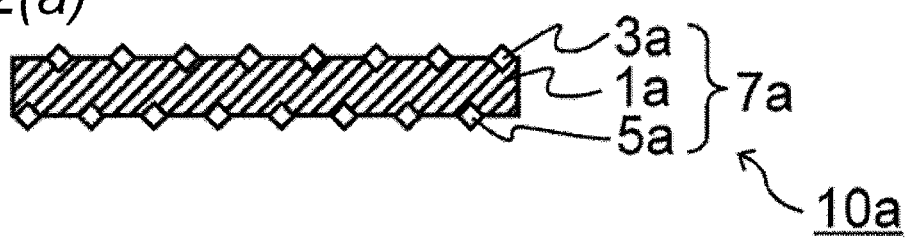
FIGS. 2(a) and 2(b) are schematic cross-sectional views illustrating particles of MXene which is a layered material usable for a conductive film in an embodiment of the present invention.
Figure 2B:
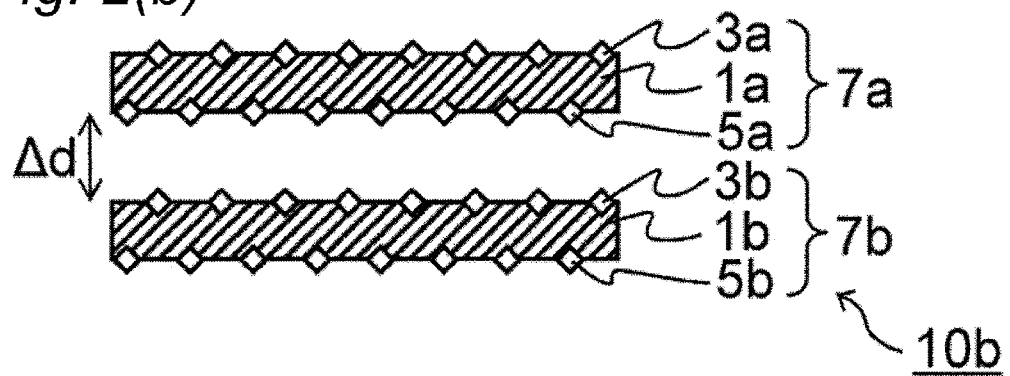

The MXene particle 10 synthesized in this manner can be a layered material particle (as examples of the MXene particle 10, a MXene particle 10a in one layer is illustrated in FIG. 2(a), and a MXene particle 10b in two layers is illustrated in FIG. 2(b), but the present invention is not limited to these examples) including one or more MXene layers 7a and 7b, as schematically illustrated in FIG. 2. More specifically, the MXene layers 7a and 7b may have layer bodies ($M_mX_n$ layers) 1a and 1b represented by $M_mX_n$, and modifications or terminations T 3a, 5a, 3b, and 5b present on a surface (more specifically, at least one of two surfaces facing each other in each layer) of the layer bodies 1a and 1b. Therefore, the MXene layers 7a and 7b may be also represented as "$M_mX_nT_s$", and s may be any number. The MXene particle 10 may be a particle in which such MXene layers are individually separated and exist in one layer (the single-layer structure illustrated in FIG. 2(a), so-called single-layer MXene particle 10a), a particle of a stack in which a plurality of MXene layers are stacked separated from each other (the multi-layer structure illustrated in FIG. 2(b), so-called multi-layer MXene particle 10b), or a mixture thereof. The MXene particle 10 can be particles (can also be referred to as powder or flakes) as an aggregate composed of the single-layer MXene particles 10a and/or the multi-layer MXene particles 10b. In the case of multi-layer MXene particles, two adjacent MXene layers (for example, 7a and 7b) do not necessarily have to be completely separated from each other, and may be partially in contact with each other. In the present embodiment, as will be described later, the MXene particles 10 preferably include more single-layer MXene particles than multi-layer MXene particles (the content of the single-layer MXene particles is high) as much as possible.

Although the present embodiment is not limited, the thickness of each layer (corresponding to the MXene layers 7a and 7b) of MXene can be, for example, 0.8 nm to 5 nm, and particularly 0.8 nm to 3 nm (the thickness can mainly vary depending on the number of M atom layers included in each layer). When the MXene particles are particles of stacks (multi-layer MXene), for each stack, the interlayer distance (alternatively, the gap dimension indicated by Δd in FIG. 2(b)) is, for example, 0.8 nm to 10 nm, particularly 0.8 nm to 5 nm, and more particularly about 1 nm.

The thickness in the direction perpendicular to the layer of MXene particles (which can correspond to the "thickness" of the MXene particles as two-dimensional particles) is, for example, 0.8 nm to, for example, 20 nm or less, particularly 15 nm or less, more particularly 10 nm or less. The total number of layers of MXene particles can be 1 or 2 or more, and can be, for example, 1 to 10, and particularly 1 to 6. When the MXene particles are particles of stacks (multi-layer MXene), the MXene particles are preferably particles of MXene having a small number of layers. The phrase "the number of layers is small" means that, for example, the number of stacked layers of MXene is six or less. In addition, the thickness of the multi-layer MXene particles having a small number of layers in the stacking direction can be 15 nm or less, particularly 10 nm or less. In the present specification, the "multi-layer MXene having a small number of layers" is also referred to as "few-layer MXene." In the present embodiment, most of the MXene particles can be particles of single-layer MXene and/or few-layer MXene, and further, most of the MXene particles can be single-layer MXene particles. In other words, the average value of the thicknesses of the MXene particles can be 10 nm or less. The average value of the thickness can be, for example, 7 nm or less, and further can be 5 nm or less. Meanwhile, in consideration of the thickness of the single-layer MXene, the lower limit of the thickness of the MXene particles can be 0.8 nm. Therefore, the average value of the thicknesses of the MXene particles can be about 1 nm or more.

The dimension (which can correspond to the "in-plane dimension" of the MXene particles as two-dimensional particles) in a plane (two-dimensional sheet plane) parallel to the layer of the MXene particles can be, for example, 0.1 µm or more, particularly 1 µm or more, and can be, for example, 200 µm or less, particularly 40 µm or less.

Note that these dimensions described above can be obtained as a number average dimension (for example, a number average of at least 40) based on a photograph of a scanning electron microscope (SEM), a transmission electron microscope (TEM) or an atomic force microscope (AFM), or a distance in a real space, calculated from a position on a reciprocal lattice space of the (002) plane measured by an X-ray diffraction (XRD) method.

The salt of a phosphoric acid group-containing polyanion can be a salt of a polyanion having a plurality of phosphoric acid groups (also simply referred to as "phosphoric acid group-containing polyanion") and a metal ion (cation). In particular, a salt of a polyanion having a plurality of phosphoric acid groups and an alkali metal ion is preferable because it can be easily dissolved in an aqueous solvent. More specifically, the salt of a phosphoric acid group-containing polyanion may be at least one selected from the group consisting of a polyphosphate metal salt, a pyrophosphate metal salt, a tripolyphosphate metal salt, or a hexametaphosphate metal salt, and is preferably a polyphosphate metal salt and/or a hexametaphosphate metal salt, and more preferably a hexametaphosphate metal salt. The average polymerization degree of the polyphosphate metal salt may be, for example, 2 to 100,000. When the metal salt is an alkali metal salt, the alkali metal element can be, for example, lithium, sodium, potassium, or the like, and is preferably sodium.

Then, a mixture containing MXene particles and a salt of a phosphoric acid group-containing polyanion in an aqueous solvent is prepared. This mixture is prepared so that the concentration of the MXene particles is 10 mg/mL to 250 mg/mL, and the molar concentration (M) of the salt of a phosphoric acid group-containing polyanion is 0.001 mol/L to 0.1 mol/L.

When the concentration of the MXene particles in the mixture is 10 mg/mL or more, a conductive film can be produced at a cost that can withstand industrial mass production, and when the concentration is 250 mg/mL or less, the mixture can be handled at a viscosity that can withstand industrial mass production. Preferably, the concentration of the MXene particles can be 20 mg/mL to 140 mg/mL. The concentration of the MXene particles is understood as a solid content concentration in the mixture. The solid content concentration can be measured by, for example, a heating dry weight measurement method, a freeze dry weight measurement method, a filtration weight measurement method, or the like.

When the concentration of the salt of a phosphoric acid group-containing polyanion in the mixture is 0.001 mol/L or more, oxidation of a finally obtained conductive film can be effectively prevented (in other words, to effectively reduce a decrease in conductivity over time), and when the concentration is 0.1 mol/L or less, a decrease in initial conductivity of a finally obtained conductive film can be effectively prevented. Preferably, the concentration of the salt can be 0.01 mol/L to 0.09 mol/L.

The aqueous solvent is typically water, and may optionally contain other liquid substances in a relatively small amount (for example, 30% by mass or less, preferably 20% by mass or less based on the entire aqueous solvent) in addition to water (the same applies hereinafter).

The method for preparing the mixture is not particularly limited. For example, a slurry (hereinafter, also referred to as "MXene slurry") containing MXene particles in an aqueous solvent and a solution (hereinafter, also referred to as "aqueous phosphoric acid group-containing polyanion salt solution") containing a salt of a phosphoric acid group-containing polyanion in an aqueous solvent may be prepared, and these may be mixed to prepare a mixture. The mixing of the aqueous phosphoric acid group-containing polyanion salt solution and the MXene slurry can be performed in any suitable manner. For example, the MXene slurry may be added to and mixed with the aqueous phosphoric acid group-containing polyanion salt solution, or vice versa.

Although the present embodiment is not bound by any theory, in this mixture, the phosphoric acid group-containing polyanion is bonded (strongly adsorbed) to a site (site to which oxygen attacks, hereinafter, simply referred to as "oxidation site") of MXene particles, which may be easily oxidized. As the oxidation site of the MXene particles, edges of the layer (sheet) of the MXene particles and defect portions of X atoms (carbon atom/nitrogen atom) are known. The edge of the MXene particles is strongly positively charged, and a dangling bond exists in the defect portion. Meanwhile, the phosphoric acid group of the phosphoric acid group-containing polyanion has many π electrons. It is therefore considered that the phosphoric acid group-containing polyanion is bonded to the oxidation site of the MXene particles by the interaction between the phosphoric acid group of the phosphoric acid group-containing polyanion and the edge and defect portion of the MXene particles (more specifically, π electrons of the phosphoric acid group and electrons of the d orbital of the M atom at the edge and defect portion of the MXene particles are mixed with each other), and a conductive path can be secured. The salt of a phosphoric acid group-containing polyanion can be insulative on its own, and it is therefore conceivable that if the salt of a phosphoric acid group-containing polyanion covers the MXene particles, the initial conductivity of a finally obtained conductive film (and the conductivity of the conductive film thereafter) is reduced. However, since π electrons can contribute to improvement in conductivity, a decrease in initial conductivity can be reduced by bonding the phosphoric acid group-containing polyanion to the oxidation site of the MXene particles by the interaction as described above.

Step (p)

Figure 1B:
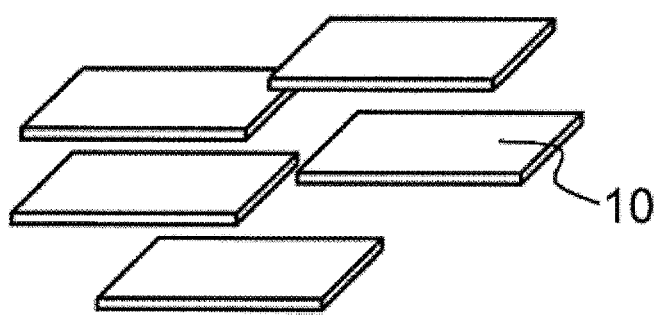

After the step (a) and before a step (b) to be described later, as an intermediate step (p), it is preferable to wash the mixture prepared in the step (a) using another (new or fresh) aqueous solvent while applying a shear force. As a result, unnecessary phosphoric acid group-containing polyanions that are not bonded to the oxidation site of the MXene particles and other unnecessary ions (cations that formed a salt of a phosphoric acid group-containing polyanion, more specifically, metal ions) can be effectively removed. By effectively removing unnecessary phosphoric acid group-containing polyanions that are not bonded to the oxidation site of the MXene particles, it is possible to reduce a decrease in initial conductivity of a finally obtained conductive film and to maintain high conductivity. In addition, when metal ions (for example, alkali metal ions such as sodium ions) as other unnecessary ions are excessively present in the mixture, the MXene particles are adsorbed to the metal ions and can be aggregated, and it is difficult to loosen aggregation simply by washing. However, by washing while applying a shear force, aggregation of the MXene particles is loosened, and an excessive amount of metal ions causing aggregation are effectively removed, whereby aggregation of the MXene particles can be reduced or prevented. By reducing or preventing aggregation of the MXene particles, as schematically illustrated in FIG. 1(b), in the finally obtained conductive film 30, the MXene particles 10 exist in a relatively aligned state, and more specifically, there are a large number of MXene particles in which two-dimensional sheet planes (planes parallel to the layer of MXene) of the MXene particles are relatively aligned (preferably, parallel) with respect to the main surface of the conductive film 30 (it can also be expressed that orientation/stacking properties are high), so that the initial conductivity of the conductive film can be improved, and high conductivity can be maintained.

More specifically, an operation of subjecting the mixture to solid-liquid separation (for example, sedimentation, centrifugation, and the like), partially removing the aqueous solvent (liquid phase) from the mixture, adding another (new or fresh) aqueous solvent to the mixture, and applying a shear force to the mixture may be performed at any appropriate timing. Such an operation may be performed once, or may be repeated twice or more in some cases.

The application of the shear force can be performed using, for example, a shaker, a shear mixer, or the like, or by handshaking, by appropriately selecting the strength, time, and the like for applying the shear force. For example, the shear force may be applied by performing a treatment for a predetermined time by an automatic shaker (manufactured by FAST & FLUID, SK-550). The shear force is desirably applied so as not to break the MXene particles, and anisotropic energy is desirably applied to the MXene particles (for example, flakes).

Step (b)

Thereafter, the mixture obtained above is dried to obtain the conductive film 30.

Before drying, a precursor of the conductive film (also referred to as "precursor film") may be formed using the mixture. A method for forming the precursor is not particularly limited, and for example, coating, suction filtration, spraying, or the like can be used. More particularly, the mixture as is or an appropriately adjusted mixture (for example, diluted with an aqueous solvent) is applied onto any appropriate substrate (the substrate may constitute a predetermined member together with the conductive film, or may be finally separated from the conductive film) with a per coater, a roll coater, a spin coater, a blade, or the like, whereby a precursor can be formed on the substrate. The mixture is appropriately adjusted (for example, diluted with an aqueous solvent), and suction-filtered through a filter (the filter may constitute a predetermined member together with the conductive film, or may be finally separated from the conductive film) installed in Nutsche or the like, to at least partially remove an aqueous solvent, whereby a precursor can be formed on the filter. The filter is not particularly limited, but a membrane filter or the like can be used. In addition, the mixture is appropriately adjusted (for example, diluted with an aqueous solvent), and sprayed onto any appropriate substrate (the substrate may constitute a predetermined member together with the conductive film, or may be finally separated from the conductive film) with a spray gun, an air brush, or the like, whereby a precursor can be formed on the substrate.

Next, the precursor formed as described above is dried to obtain the conductive film 30. In the present disclosure, the term "drying" means removing an aqueous solvent that can be present in the precursor.

Drying may be performed under mild conditions such as natural drying (typically, the precursor is disposed in an air atmosphere at room temperature and normal pressure) or air drying (blowing air), or may be performed under relatively active conditions such as hot air drying (blowing heated air), heat drying, and/or vacuum drying.

The formation and drying of the precursor may be appropriately repeated until a desired thickness of the conductive film is obtained. For example, a combination of spraying and drying may be repeated a plurality of times.

The conductive film 30 of the present embodiment thus obtained contains the MXene particles 10 and further contains a phosphorus atom in an amount of 0.001 mass % to less than 0.09 mass %.

The phosphorus atom in the conductive film is derived from the salt of a phosphoric acid group-containing polyanion. Such a phosphorus atom is preferably bonded to the oxidation site of the MXene particles in the form of a phosphoric acid group-containing polyanion as described above. As a result, the oxidation site of the MXene particles is protected by the phosphoric acid group-containing polyanion, and even when the conductive film is exposed to an oxidation atmosphere (typically, air) containing oxygen or the like, the oxidation site of the MXene particles can be prevented from being attacked by oxygen or the like, and the oxidation of the MXene particles can be prevented.

When the content of the phosphorus atom in the conductive film is 0.001 mass % or more, an effect of preventing oxidation can be obtained (a decrease in conductivity over time can be reduced), and when the content is less than 0.09 mass %, a decrease in initial conductivity can be reduced. Preferably, the content of the phosphorus atom can be 0.01 mass % to 0.08 mass %. The content of the phosphorus atom can be measured by, for example, elemental (atomic) analysis such as inductively coupled plasma atomic emission spectroscopy (ICP-AES) or X-ray fluorescence analysis (XRF).

The conductive film may also contain a metal element (for example, an alkali metal) corresponding to a metal ion derived from the salt of a phosphoric acid group-containing polyanion in an amount of 0.5 mass % or less. When the content of the metal element in the conductive film is 0.5 mass % or less, aggregation of the MXene particles can be reduced or prevented, and a decrease in initial conductivity can be reduced. Preferably, the content of the metal element can be 0.001% by mass to less than 0.09% by mass. The content of the metal element can be measured by, for example, ICP-AES or XRF.

The conductive film of the present embodiment may be composed of a composite material of MXene particles, a phosphoric acid group-containing polyanion, and optionally a metal element that can remain therein.

The conductive film of the present embodiment maintains a conductivity of 2,000 S/cm or more, preferably 3,000 S/cm or more. More specifically, the conductive film maintaining a conductivity of 2,000 S/cm or more, preferably 3,000 S/cm or more means that when the conductive film is stored in air (for example, humidity of 50% or less, typically humidity of 0%) at room temperature (for example, 0 to 40° C., in particular 10 to 30° C., typically 25° C.) and normal pressure (typically at atmospheric pressure, in particular at standard atmospheric pressure, specifically at about 0.1 MPa), the conductive film can exhibit a conductivity of 2,000 S/cm or more, preferably 3,000 S/cm or more, for example, over 30 days, preferably 50 days or more. Since it is considered that the conductivity of the conductive film tends to decrease over time if there is no measurement variation, when the conductivity of the conductive film after a lapse of a predetermined time (days) (and preferably, the initial conductivity of the conductive film) is (are) 2,000 S/cm or more, preferably 3,000 S/cm or more, it may be understood that the conductive film maintains a conductivity of 2,000 S/cm or more, preferably 3,000 S/cm or more. The initial conductivity of the conductive film can be typically 3,000 S/cm or more, and preferably 4,000 S/cm or more when the conductivity of a conductive film after being stored for 1 day under the above conditions after the production of the conductive film is taken as the initial conductivity. The conductivity of a conductive film after being stored for, for example, 30 days, preferably 50 days or more under the above conditions after the production of the conductive film can be 2,000 S/cm or more, preferably 3,000 S/cm or more, and the decreasing rate of the conductivity based on the initial conductivity can be 30% or less, 15% or less, and preferably 12% or less. When it is unknown when the conductive film is produced, if the conductivity of a conductive film after being stored for, for example, 30 days, preferably 50 days under the above conditions from an optional time point is 2,000 S/cm or more, it is understood that the conductive film maintains a conductivity of 2,000 S/cm or more. The upper limit of the conductivity of the conductive film is not particularly limited, but can be, for example, 10,000 S/cm or less. The conductivity can be calculated from measured values obtained by measuring the resistivity and the thickness of the conductive film.

The conductive film of the present embodiment can have a form as a so-called film, and specifically can have two main surfaces facing each other. The thickness of the conductive film, the shape and dimension in planar view, and the like can be appropriately selected according to the application of the conductive film.

The conductive film of the present embodiment can be utilized for any appropriate application. The conductive film of the present embodiment can be utilized, for example, in applications where maintaining high conductivity (reducing a decrease in initial conductivity and preventing oxidation) is required, such as an electrode and an electromagnetic shield (EMI shield) in any suitable electronic device.

The electrode is not particularly limited, and can be, for example, a capacitor electrode, a battery electrode, a bioelectrode, a sensor electrode, an antenna electrode, or the like. By using the conductive film of the present embodiment, it is possible to obtain a capacitor and a battery having a large capacity, a bioelectrode having a low impedance, a sensor and an antenna having a high sensitivity, even with a smaller capacity (device occupied volume).

The capacitor can be an electrochemical capacitor. The electrochemical capacitor is a capacitor utilizing capacitance developed due to a physicochemical reaction between electrodes (electrode active material) and ions (electrolyte ions) in an electrolytic solution, and can be used as a device (power storage device) that stores electric energy. The battery can be a repeatedly chargeable and dischargeable chemical battery. The battery can be, for example, but not limited to, a lithium ion battery, a magnesium ion battery, a lithium sulfur battery, a sodium ion battery, or the like.

The bioelectrode is an electrode for acquiring a biological signal. The bioelectrode can be, for example, but not limited to, an electrode for measuring EEG (electroencephalogram), ECG (electrocardiogram), EMG (electromyogram), and EIT (electrical impedance tomography).

The sensor electrode is an electrode for detecting a target substance, state, abnormality, and the like. The sensor can be, for example, but not limited to, a gas sensor, a biosensor (a chemical sensor utilizing a molecular recognition mechanism of biological origin), and the like.

The antenna electrode is an electrode for emitting an electromagnetic wave into space and/or receiving an electromagnetic wave in space.

In particular, by using the conductive film of the present embodiment, an electromagnetic shield having a high shielding rate (EMI shielding properties) can be obtained. In general, the EMI shielding properties are calculated with respect to the conductivity as shown in Table 1 on the basis of the following Equation (1):

$$SE = 50 + 10\log\left(\frac{\sigma}{f}\right) + 1.7t\sqrt{\sigma f} \qquad (1)$$

In Equation (1), SE is EMI shielding properties (dB), σ is conductivity (S/cm), f is frequency (MHz) of electromagnetic wave, and t is film thickness (cm).

TABLE 1

| Conductivity (S/cm) | EMI shielding properties (dB)* |
|---|---|
| 100 | 41 |
| 1,000 | 52 |
| 2,000 | 55 |
| 3,000 | 58 |
| 4,000 | 59 |
| 5,000 | 61 |
| 6,000 | 62 |
| 7,000 | 63 |
| 8,000 | 64 |
| 9,000 | 65 |
| 10,000 | 65 |

*Here, f is 1,000 MHz and t is $1 \times 10^{-4}$ cm.

As understood from Table 1, when the conductivity is 2,000 S/cm or more, high EMI shielding properties are obtained. The conductive film of the present embodiment has a conductivity of 2,000 S/cm or more, and thus can provide higher EMI shielding properties when the thickness is constant, and can provide a sufficient EMI shielding effect even when the thickness is reduced.

Although the conductive film in an embodiment of the present invention has been described in detail through the method for producing the conductive film, the present invention can be modified in various ways. Note that the conductive film of the present invention may be produced by a method different from the production method in the above-described embodiment, and the method for producing a conductive film of the present invention is not limited only to those providing the conductive film in the above-described embodiment.

EXAMPLES

Example 1

Example 1 relates to an example in which a conductive film was produced using sodium hexametaphosphate as a salt of a phosphoric acid group-containing polyanion at an appropriate concentration.

Preparation of Mixture $Ti_3AlC_2$ particles were prepared as MAX particles by a known method. The $Ti_3AlC_2$ particles (powder) were added to 9 mol/L hydrochloric acid together with LiF (for 1 g of $Ti_3AlC_2$ particles, 1 g of LiF and 10 mL of 9 mol/L hydrochloric acid were used), and the mixture was stirred with a stirrer at 35° C. for 24 hours to obtain a solid-liquid mixture (suspension) containing a solid component derived from the $Ti_3AlC_2$ particles. The operation of washing the mixture with pure water and separating and removing a supernatant using a centrifuge (the remaining sediment obtained by removing the supernatant is washed again) was repeated about 10 times. Then, a mixture obtained by adding pure water to the sediment was stirred with an automatic shaker for 15 minutes, and then subjected to centrifugation operation for 5 minutes with a centrifuge to separate the mixture into a supernatant and a sediment, and the supernatant was separated and removed by centrifugal dehydration. Pure water was added to the remaining sediment excluding the supernatant, to thereby dilute the sediment, and a partially purified slurry is thus obtained. It is understood that the partially purified slurry can contain, as MXene particles, single-layer MXene particles and multi-layer MXene particles that are not formed into a single layer due to insufficient layer separation (delamination), and further contains impurities other than MXene particles (unreacted MAX particles and crystals of byproducts derived from etched A atoms (for example, crystals of $AlF_3$), and the like).

The partially purified slurry obtained above was placed in a centrifuge tube, and subjected to centrifugation at a relative centrifugal force (RCF) of 2,600×g for 5 minutes using a centrifuge. The centrifugally separated supernatant was recovered to obtain a purified slurry. It is understood that the purified slurry contains a large amount of single-layer MXene particles as MXene particles. The remaining sediment excluding the supernatant was not used thereafter.

The purified slurry obtained above was placed in a centrifuge tube, and subjected to centrifugation at a RCF of 3,500×g for 120 minutes using a centrifuge. The centrifugally separated supernatant was separated and removed. The separated and removed supernatant was not used thereafter. A clay-like substance (clay) was obtained as the remaining sediment excluding the supernatant. As a result, a $Ti_3C_2T_s$-water dispersion clay was obtained as a MXene clay. The MXene clay and pure water were mixed in appropriate amounts to prepare a MXene slurry having a solid content concentration (MXene concentration) of about 74 mg/mL.

Then, 0.30 g (about $5\times10^{-4}$ mol) of sodium hexametaphosphate (manufactured by NACALAI TESQUE, INC.) was weighed and dissolved in 39.86 mL of pure water to prepare an aqueous sodium hexametaphosphate solution as an aqueous phosphoric acid group-containing polyanion salt solution.

About 10.14 mL (10.89 g) of the MXene slurry (solid content concentration: about 74 mg/mL) prepared above was added to the aqueous phosphoric acid group-containing polyanion salt solution to prepare a mixture having a total amount of 50 mL. This mixture had a MXene concentration of 15 mg/mL and a sodium hexametaphosphate concentration of 0.01 mol/L.

Washing of Mixture

The mixture prepared above was transferred to a centrifuge tube, thoroughly shaken, and then allowed to stand for 3 hours. Thereafter, the mixture in the centrifuge tube was (i) subjected to centrifugation at 5,000 rpm for 2 minutes, (ii) the supernatant was discarded from the mixture after centrifugation, (iii) pure water was added to the remainder so as to be a total amount of 50 mL, and (iv) a shearing force was applied by handshaking. The operations (i) to (iv) were repeated three times in total.

Removal and Drying of Aqueous Medium

After the third handshaking, 5 mL of the mixture in the centrifuge tube was collected with a dropper and suction-filtered. A membrane filter (Durapore, manufactured by Merck KGaA, pore size: 0.45 μm) was used as a filter for suction filtration. After suction filtration, a precursor film on the filter was dried in a vacuum drying oven at 80° C. overnight to obtain a conductive film.

Example 2

Example 2 relates to an example in which a conductive film was produced using sodium polyphosphate at an appropriate concentration as a salt of a phosphoric acid group-containing polyanion.

A mixture was prepared in the same manner as in Example 1 except that an aqueous sodium polyphosphate solution prepared by weighing 0.14 g (about $5\times10^{-4}$ mol) of sodium polyphosphate (manufactured by Kanto Chemical Co., Inc.) and dissolving the sodium polyphosphate in 39.86 mL of pure water was used as an aqueous phosphoric acid group-containing polyanion salt solution. This mixture had a MXene concentration of 15 mg/mL and a sodium polyphosphate concentration of 0.01 mol/L. Thereafter, a conductive film was obtained in the same manner as in Example 1.

Comparative Example 1

Comparative Example 1 relates to an example in which a conductive film was produced without using a salt of a phosphoric acid group-containing polyanion.

A mixture was prepared in the same manner as in Example 1 except that pure water was used instead of the aqueous phosphoric acid group-containing polyanion salt solution. This mixture had a MXene concentration of 15 mg/mL. Thereafter, a conductive film was obtained in the same manner as in Example 1.

Comparative Example 2

Comparative Example 2 relates to an example in which a conductive film was produced using sodium hexametaphosphate at a high concentration as a salt of a phosphoric acid group-containing polyanion.

A mixture was prepared in the same manner as in Example 1 except that a high-concentration aqueous sodium hexametaphosphate solution prepared by weighing 3.05 g (about $5\times10^{-3}$ mol) of sodium hexametaphosphate (manufactured by NACALAI TESQUE, INC.) and dissolving the sodium hexametaphosphate in 39.86 mL of pure water was used as an aqueous phosphoric acid group-containing polyanion salt solution. This mixture had a MXene concentration of 15 mg/mL and a sodium hexametaphosphate concentration of 0.1 mol/L. Thereafter, a conductive film was obtained in the same manner as in Example 1.

Comparative Example 3

Comparative Example 3 relates to an example in which a conductive film was produced using sodium polyphosphate at a high concentration as a salt of a phosphoric acid group-containing polyanion. Comparative Example 3 can be understood to correspond to the contents disclosed in Non-Patent Document 1.

A mixture was prepared in the same manner as in Example 1 except that an aqueous sodium polyphosphate solution prepared by weighing 1.33 g (about $5 \times 10^{-3}$ mol) of sodium polyphosphate (manufactured by Kanto Chemical Co., Inc.) and dissolving the sodium polyphosphate in 39.86 mL of pure water was used as an aqueous phosphoric acid group-containing polyanion salt solution. This mixture had a MXene concentration of 15 mg/mL and a sodium polyphosphate concentration of 0.1 mol/L. Thereafter, a conductive film was obtained in the same manner as in Example 1.

(Evaluation)

The conductive films (samples) on the filters of Examples 1 to 2 and Comparative Examples 1 to 3 after production as described above were stored under an air environment (humidity: 0%) of room temperature and normal pressure, and the conductivity (S/cm) of each of the conductive films was measured one day after production (initial stage) and thereafter every predetermined period until a maximum of 50 days. More specifically, for the conductivity, the resistivity (surface resistivity) ($\Omega$) and the thickness ($\mu$m) (the filter has been removed) were measured at three points per sample, the conductivity (S/cm) was calculated from these measured values, and the arithmetic average value of the conductivities at three points thus obtained was adopted. A low resistivity meter (Loresta AX MCP-T370, manufactured by Mitsubishi Chemical Analytech Co., Ltd.) was used for measurement of the resistivity. A micrometer (MDH-25 MB, manufactured by Mitutoyo Corporation) was used for measurement of the thickness. The results are shown in Table 2 and FIG. 3.

For the conductive films (samples) of Examples 1 to 2 and Comparative Examples 1 to 3 produced above, the phosphorus (more specifically, phosphorus atom) content was measured by ICP-AES. The results are also shown in Table 2. In the conductive film of Comparative Example 1, phosphorus could not be detected because the value of the content was less than the detection limit of phosphorus (0.0003% by mass).

TABLE 2

| | Conductivity (S/cm) | | Phosphorus content (mass %) |
|---|---|---|---|
| | After 1 day (initial stage) | After 50 days (%) | |
| Example 1 | 5899 | 5816(99%) | 0.021 |
| Example 2 | 5713 | 5619(98%) | 0.049 |
| Comparative Example 1 | 6494 | 4062(63%) | Not detected |
| Comparative Example 2 | 2482 | — | 0.24 |
| Comparative Example 3 | 519 | — | 0.11 |

In Table 2, the symbol "—" indicates that the measurement was omitted.

Referring to Table 2, the initial conductivity of the conductive film of Comparative Example 1 (control) was 6,494 S/cm, the initial conductivity of the conductive film of Example 1 was 5,899 S/cm, and the initial conductivity of the conductive film of Example 2 was 5,713 S/cm. Therefore, based on the initial conductivity of the conductive film of Comparative Example 1, the decreasing rate of the initial conductivity of the conductive film of Example 1 was about 9%, and the decreasing rate of the initial conductivity of the conductive film of Example 2 was about 12%, and thus the decreasing rates of both conductive films were 15% or less. On the other hand, the initial conductivity of the conductive film of Comparative Example 2 was 2,482 S/cm, and the initial conductivity of the conductive film of Comparative Example 3 was 519 S/cm. Therefore, based on the initial conductivity of the conductive film of Comparative Example 1, the decreasing rate of the initial conductivity of the conductive film of Comparative Example 2 was about 62%, and the decreasing rate of the initial conductivity of the conductive film of Comparative Example 3 was about 92%. From these results, it was confirmed that when the concentration of the salt of a phosphoric acid group-containing polyanion is appropriate, a decrease in initial conductivity can be reduced, whereas when the concentration of the salt of a phosphoric acid group-containing polyanion is too high, the initial conductivity is significantly decreased. In Comparative Examples 2 and 3, it is considered that the presence of an excessive amount of the salt of a phosphoric acid group-containing polyanion (particularly, sodium ion) causes aggregation of MXene, and deteriorates the orientation of the MXene particles. In particular, in the conductive film of Comparative Example 3 (sodium polyphosphate: 0.1 mol/L), the initial conductivity decreased to about 1/10.

Figure 3:
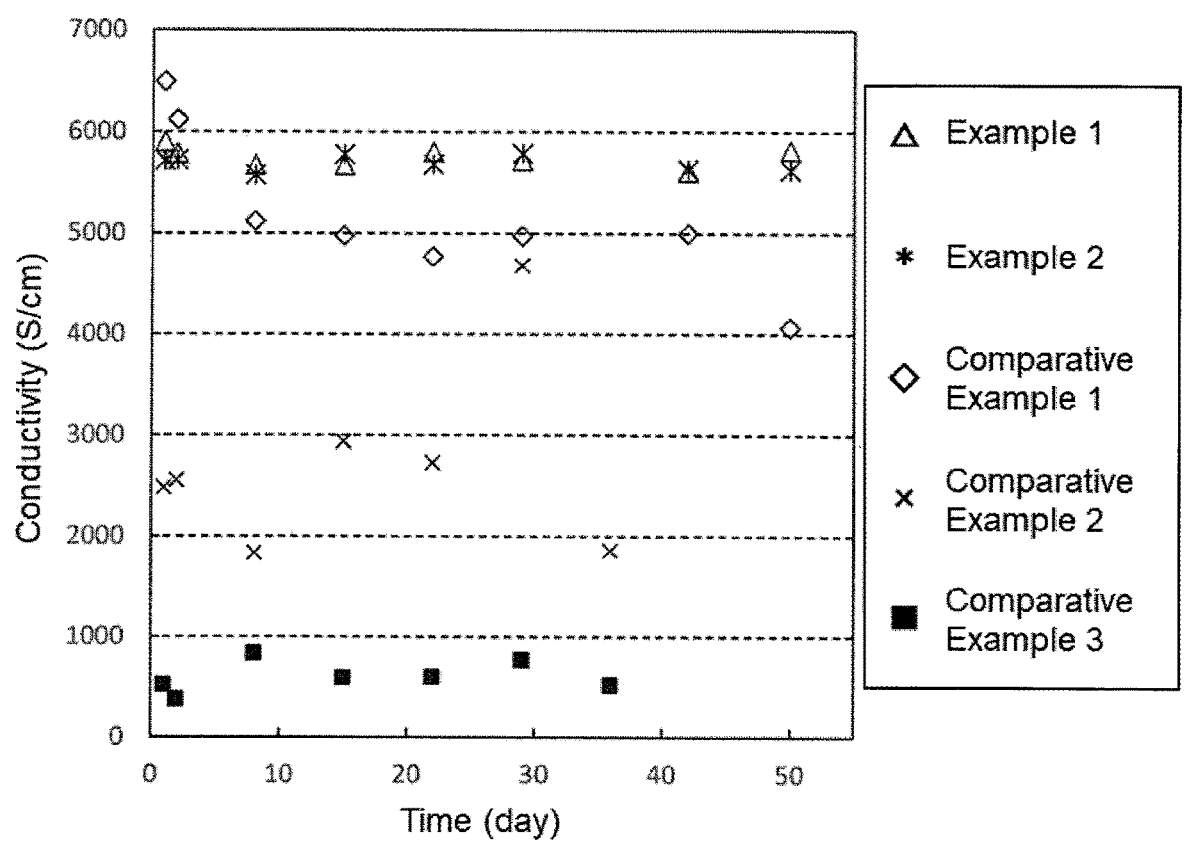
FIG. 3 is a graph showing changes over time in conductivity of conductive films produced in Examples 1 to 2 and Comparative Examples 1 to 3.

For the change over time in conductivity of the conductive film, with reference to Table 2 and FIG. 3, the conductivity in Comparative Example 1 (control) decreased to about 63% or less at the time when 50 days elapsed, with the initial conductivity of the conductive film of Comparative Example 1 being 100%. On the other hand, the conductivity in Examples 1 and 2 could be maintained at about 95% or more (that is, the decreasing rate was 5% or less) over 50 days, with the initial conductivity of the conductive films of Examples 1 and 2 being 100%. In Comparative Examples 2 to 3 in which the initial conductivity was significantly decreased as described above, the conductivity of the conductive film after 36 days was not measured.

The conductive film of the present invention can be utilized for any appropriate application, and can be particularly preferably used, for example, as electrodes and electromagnetic shields in electronic devices.

DESCRIPTION OF REFERENCE SIGNS 1a, 1b: Layer body ($M_mX_n$ layer)
3a, 5a, 3b, 5b: Modification or termination T
7a, 7b: MXene layer
10, 10a, 10b: MXene (layered material) particle
30: Conductive film

The invention claimed is:

1. A conductive film comprising:
  particles of a layered material including one or more layers, wherein each of the one or more layers includes a layer body represented by:

$M_mX_n$ wherein M is at least one metal of Group 3, 4, 5, 6, or 7,
  X is a carbon atom, a nitrogen atom, or a combination thereof,
  n is 1 to 4,
  m is greater than n and 5 or less, and
  a modification or termination T is present on a surface of the layer body, where the T is at least one selected from the group consisting of a hydroxyl group, a fluorine atom, a chlorine atom, an oxygen atom, or a hydrogen atom; and a phosphorus atom in an amount of 0.001% by mass to less than 0.09% by mass.

2. The conductive film according to claim 1, wherein the phosphorus atom is derived from a salt of a phosphoric acid group-containing polyanion.

3. The conductive film according to claim 2, wherein the salt of the phosphoric acid group-containing polyanion is at least one selected from the group consisting of a polyphosphate metal salt, a pyrophosphate metal salt, a tripolyphosphate metal salt, or a hexametaphosphate metal salt.

4. The conductive film according to claim 1, wherein the M is at least one selected from the group consisting of Ti, Zr, Hf, V, Nb, Ta, Cr, Mo, or Mn.

5. The conductive film according to claim 1, wherein the phosphorus atom is bonded to an oxidation site of the particles of the layered material.

6. The conductive film according to claim 1, wherein the amount of the phosphorus atom is 0.01 mass % to 0.08 mass %.

7. The conductive film according to claim 1, further comprising a metal element in an amount of 0.5 mass % or less.

8. The conductive film according to claim 7, wherein the amount of the metal element is 0.001 mass % to 0.09 mass %.

9. An electrode comprising the conductive film according to claim 1.

10. The electrode according to claim 9, wherein the electrode is any one of a capacitor electrode, a battery electrode, a bioelectrode, a sensor electrode, or an antenna electrode.

11. An electromagnetic shield comprising the conductive film according to claim 1.

* * * * *